United States Patent [19]

Gibson et al.

[11] Patent Number: 5,177,611
[45] Date of Patent: Jan. 5, 1993

[54] METHOD AND APPARATUS FOR CANCELING QUADRATURE DISTORTION AS FOR VIDEO SIGNALS HAVING IN-PHASE AND QUADRATURE PHASE COMPONENTS

[75] Inventors: James J. Gibson, Princeton; Krishnamurthy Jonnalagadda, Plainsboro, both of N.J.

[73] Assignee: RCA Licensing Corporation, Princeton, N.J.

[21] Appl. No.: 560,943

[22] Filed: Jul. 31, 1990

[51] Int. Cl.⁵ .............................................. H04N 5/21
[52] U.S. Cl. ................................... 358/167; 358/909
[58] Field of Search ........................... 358/36, 167, 909

[56] References Cited

U.S. PATENT DOCUMENTS

| | | | |
|---|---|---|---|
| 3,914,691 | 10/1975 | Meadors, Jr. | 325/42 |
| 4,285,006 | 8/1981 | Kurahashi et al. | 358/35 |
| 4,616,252 | 10/1986 | Schiff | 358/23 |
| 4,688,096 | 8/1987 | Campbell et al. | 358/167 |
| 4,703,357 | 10/1987 | Ng et al. | 358/166 |
| 4,864,403 | 9/1989 | Chao et al. | 358/167 |
| 4,870,480 | 9/1989 | Chao | 358/23 |
| 4,882,614 | 11/1989 | Kageyama et al. | 358/12 |
| 4,980,767 | 12/1990 | Chao et al. | 358/167 |

OTHER PUBLICATIONS

"Adaptive Multipath Equalization for T.V. Broadcasting", H. Thedick, IEEE Transactions on Consumer Electronics, May 1977, pp. 175–181.

"An NTSC Compatible Wide Screen Television System with Evolutionary Extendibility", S. Kageyama et al., IEEE Transactions on Consumer Electronics, vol. 34, No. 3, Aug. 1988, pp. 460–468.

Hurst, "Dual, Single Sideband: A Crosstalk-Resistant Alternative to Quadrature Modulation with Applications in ACTV", IEEE 1988 International Conference on Consumer Electronics, Rosemont (US) 8–10 Jun. 1988, Digest of Tech. Papers, ICEE, pp. 140–141.

*Primary Examiner*—James J. Groody
*Assistant Examiner*—Mark R. Powell
*Attorney, Agent, or Firm*—Joseph S. Tripoli; Eric P. Herrmann; James B. Hayes

[57] ABSTRACT

High definition or enhanced television signals include supplementary information which is double-sideband modulated in quadrature with the picture carrier, and passed through an inverse Nyquist filter before being combined with a conventional vestigial sideband modulated main video signal. A receiver which recovers both the main video signal and the supplementary information processes the received video signal through an IF filter having a vestigial sideband frequency response characteristic. Two synchronous detectors recover in-phase and quadrature phase signal components from the filtered television signals, these recovered signals each include quadrature crosstalk distortion components from the other signal. The crosstalk from the supplementary signal into the main signal is canceled by filtering the recovered quadrature signal and adding the result to the recovered in-phase signal. This filtering also equalizes the in-phase signal by converting the quadrature distortion components in the recovered quadrature signal into reenforcing signal components in the in-phase signal. This signal recovery system is advantageously used with a ghost cancellation system.

13 Claims, 7 Drawing Sheets

INVERSE NYQUIST FILTER

NYQUIST FILTER

VESTIGIAL SIDEBAND FILTER

MODIFIED HILBERT FILTER

HILBERT FILTER

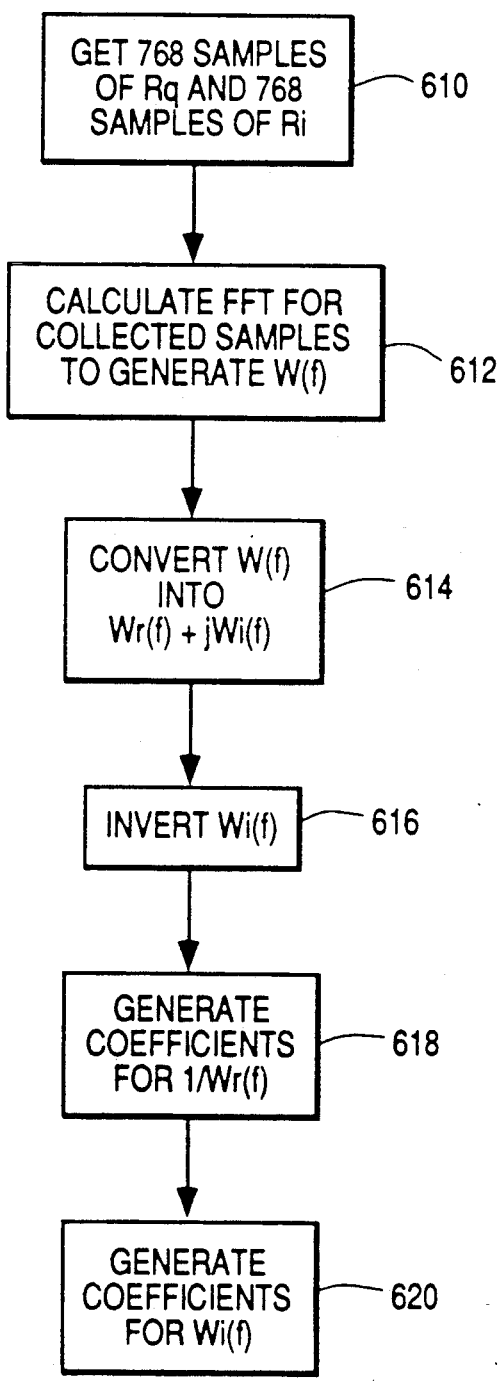

METHOD AND APPARATUS FOR CANCELING QUADRATURE DISTORTION AS FOR VIDEO SIGNALS HAVING IN-PHASE AND QUADRATURE PHASE COMPONENTS

FIELD OF THE INVENTION

This invention relates to quadrature distortion cancellation systems suitable for use with advanced television signals that include information modulated in quadrature with the picture carrier signal.

BACKGROUND OF THE INVENTION

Recently, with the increased interest in developing a new standard for transmitting high-definition television signals, there have been several proposals to include supplemental video information modulated on a subcarrier that is in quadrature with the picture carrier. One of these exemplary systems is described in a paper by M. A. Isnardi et al. entitled "Decoding Issues In The ACTV System", IEEE Trans. on Consumer Electronics, Vol. 34, No. 1, 2/88, pp. 111-120, and another is described in a paper by Y. Yasumoto et al. entitled "A Wide Aspect Ratio Television System With Full NTSC Compatibility", IEEE Trans. on Consumer Electronics, Vol. 34, No. 1, 2/88, pp. 121-127.

FIG. 1, labeled "prior art" is a block diagram showing an exemplary video signal transmission and reception system in which information is modulated in quadrature with the picture carrier signal. The system shown in FIG. 1 is substantially the same as that shown in U.S. Pat. No. 4,882,614, entitled MULTIPLEX SIGNAL PROCESSING APPARATUS, which is hereby incorporated by reference. In the system shown in FIG. 1, a main video signal S1(t) is modulated, by a modulator 114, onto a picture carrier signal $2\cos(2\pi f_0 t)$ provided by a source 118. The signal S1(t) may be, for example, a standard NTSC composite video signal. The double sideband signal provided by the modulator 114 is filtered by a vestigial sideband (VSB) filter 121. The filter 121 produces a VSB signal having a double sideband portion, occupying a band of frequencies approximately 750 KHz below and above the picture carrier signal, and a single sideband portion, occupying a band of frequencies between approximately 750 KHz and 4.2 MHz above the picture carrier. An exemplary frequency response characteristic for the VSB filter 121 is shown in FIG. 3c.

A second modulator 116 modulates a carrier signal $2\sin(2\pi f_0 t)$ with a supplementary video signal S2(t). The carrier signal $2\sin(2\pi f_0 t)$ is in quadrature (i.e. shifted in phase by 90°) with respect to the picture carrier signal. The supplementary video signal may include, for example, information on relatively high frequency signal components of a high-definition television signal, or information to be used to convert the aspect ratio of the video signal from the standard 4:3 to a wide screen 16:9.

In the exemplary system shown in FIG. 1, the double sideband modulated supplementary signal developed by the modulator 116 is applied to an inverse Nyquist filter 122. An inverse Nyquist filter has a response which is the complex conjugate (about the picture carrier) of the Nyquist filter response of most television receivers. The filter 122, which may have the frequency response characteristic shown in FIG. 3a, produces an output signal which is added, by signal summing circuitry 124, to the signal provided by the VSB filter 121.

The signal provided by the summing circuitry 124 is the output signal of the transmitter. This signal is sent to the viewer through a multipath channel which includes both a direct signal propagation path and reflecting paths which generate multipath distortion in the received video signal.

When the signal is received by the tuner (not shown) of a television receiver, it is applied to an intermediate frequency (IF) amplifier 127. In the exemplary receiver shown in FIG. 1, the IF amplifier 127 includes two filters, a Nyquist filter 128 and a band pass filter 129. The Nyquist filter 128 converts the received VSB signal into a signal which, when demodulated, produces a baseband signal having no substantial attenuation in its frequency spectrum from 0 MHz to 4.2 MHz.

In the exemplary high-definition television receiver shown in FIG. 1, the Nyquist filter 128 also reduces the amplitude of the modulated supplementary signal S2(t). Furthermore, if the Nyquist filter 128 is matched to the inverse Nyquist filter 122 in the transmitter, the filter 128 substantially reduces crosstalk of the quadrature signal into the in-phase signal by making the sidebands of the modulated quadrature signal symmetric about the picture carrier.

The band-pass filter 129 passes only the double sideband portion of the in-phase signal and the inverse-Nyquist filtered double sideband quadrature signal. The signals provided by the filters 128 and 129 of the IF amplifier 127 are applied to respective synchronous demodulators 130 and 132.

The demodulators 130 and 132 multiply the output signals provided by the Nyquist filter 128 and the band pass filter 129 by the recovered in-phase picture carrier signal $RC_i$ and quadrature picture carrier signal $RC_q$, respectively. The signals produced by the demodulators 130 and 132 are filtered by the respective low pass filters 138 and 140 to produce in-phase and quadrature phase baseband signals $R_i$ and $R_q$, respectively. The signals $R_i$ and $R_q$ are processed by a ghost reduction filter 142, to produce the recovered baseband signals S1'(t) and S2'(t).

It has been known for many years that systems for canceling multipath distortion in standard television signals (i.e. ghost cancellation systems) work best if they operate on both the in-phase and quadrature phase components of the received video signals. A reflecting object which gives rise to multipath distortion may add a delayed and attenuated version of the quadrature phase component into the in-phase component of a video signal. The amount by which the phase of a ghost signal is shifted with respect to the original signal determines the relative proportions of in-phase and quadrature phase signal in the ghost signal.

Exemplary systems for correcting multipath distortion by using a complex filter operating on both the in-phase video and quadrature phase video signals are disclosed in U.S. Pat. Nos. 4,703,357 to Ng et al. and 4,864,403 to Chao et al., which are hereby incorporated by reference. The signals being processed by these systems include meaningful information only in the in-phase component of the video signal. The quadrature phase component exists only because standard television signals are transmitted using vestigial sideband modulation and thus have unequal sidebands relative to the picture carrier.

As shown in FIG. 1, the in-phase carrier signal $RC_i$ is recovered from the received modulated video signal by picture carrier extraction circuitry 123. This signal is then shifted 90° in phase by phase shifter 125 to generate the quadrature phase carrier signal $RC_q$. In the absence of significant multipath distortion, the recovered carriers $RC_i$ and $RC_q$ are at substantially the same frequency and phase as the respective carrier signals $2COS(2\pi f_0 t)$ and $2SIN(2\pi f_0 t)$ that were modulated to generate the transmitted video signal. When, however, a significant ghost signal distorts the received video signal, the recovered carrier signals $RC_i$ and $RC_q$ may be shifted in phase significantly with respect to the original carrier signals. The difference between the recovered carrier signals and the original carrier signals occurs because the carrier extracted by the receiver is the vector sum of the main carrier signal and the ghost carrier signals. When a ghost carrier signal which is shifted in phase with respect to the main carrier signal has a significant amplitude, there may be a substantial difference between the carrier signals derived from this vector sum and the transmitted carrier signals. This difference in phase may produce significant crosstalk distortion between the detected in-phase and quadrature phase signals.

As set forth above, to avoid crosstalk between the in-phase and quadrature phase signals, the receiver shown in FIG. 1 includes separate IF filters, and presumably separate IF amplifiers. Even with these separate filters there may, be crosstalk of the quadrature phase signal into the in-phase signal if there is a mismatch between the respective slopes and/or breakpoints of the inverse Nyquist filter 122 used in the transmitter and the Nyquist filter 128 used in the receiver.

The use of a separate IF filter and IF amplifier for the supplementary signal adds cost to the receiver and complicates its design. The design complications arise because the signal propagation paths of the signals $S1'(t)$ and $S2'(t)$ are different. Thus, the group delay characteristics of the two filters must either be matched or compensated in other circuitry to ensure that the images produced by the signals $S1'(t)$ and $S2'(t)$ are properly aligned on the display.

SUMMARY OF THE INVENTION

The present invention is embodied in apparatus for receiving a television signal which has information modulated onto a carrier signal that is in a quadrature phase relationship with the picture carrier signal of the television signal and that has been filtered, prior to transmission, to have unequal energy in its sidebands. The received video signal is applied to first and second synchronous detectors which extract first and second baseband signals from the television signal using respective quadrature phase related carrier signals recovered from the filtered television signal. The recovered second baseband signal is then applied to a phase translating filter which generates an output signal that substantially cancels any crosstalk of the second baseband signal into the first baseband signal.

According to one aspect of the invention, the phase translating filter is a modified Hilbert filter which compensates for the inverse Nyquist filtering of the modulated quadrature phase signal.

According to another aspect of the invention, the phase translating filter is an adaptive complex filter which processes the second baseband signal to compensate for crosstalk into the first baseband signal based on a training signal occurring during a training interval of the received television signal.

BRIEF DESCRIPTION OF THE DRAWINGS

FIG. 6 is a flow-chart diagram which is useful for explaining the operation of the system shown in FIGS. 5a and 5b.

DETAILED DESCRIPTION

Figure 1:
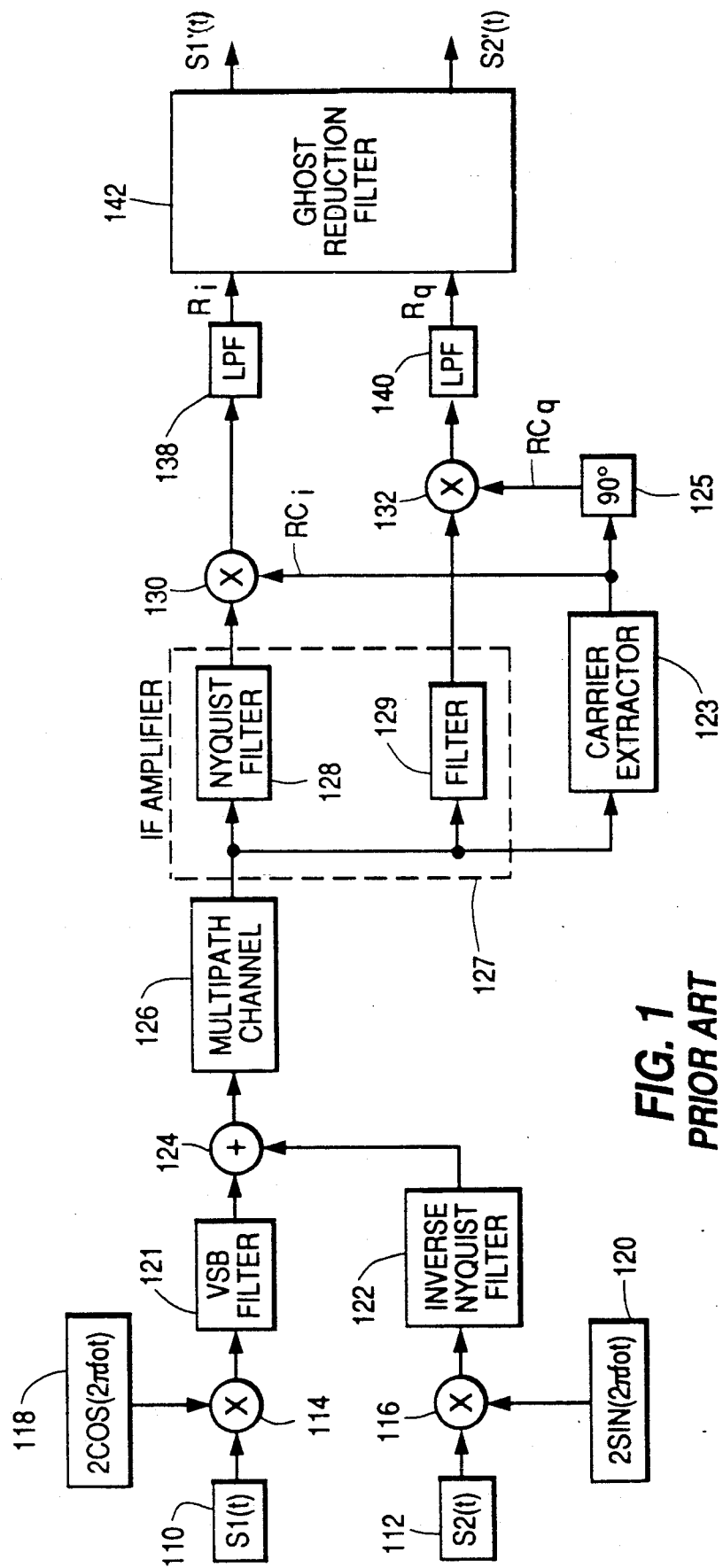
FIG. 1 (prior art) is a block diagram of circuitry which is useful for explaining the operational environment of the present invention.
Figure 2:
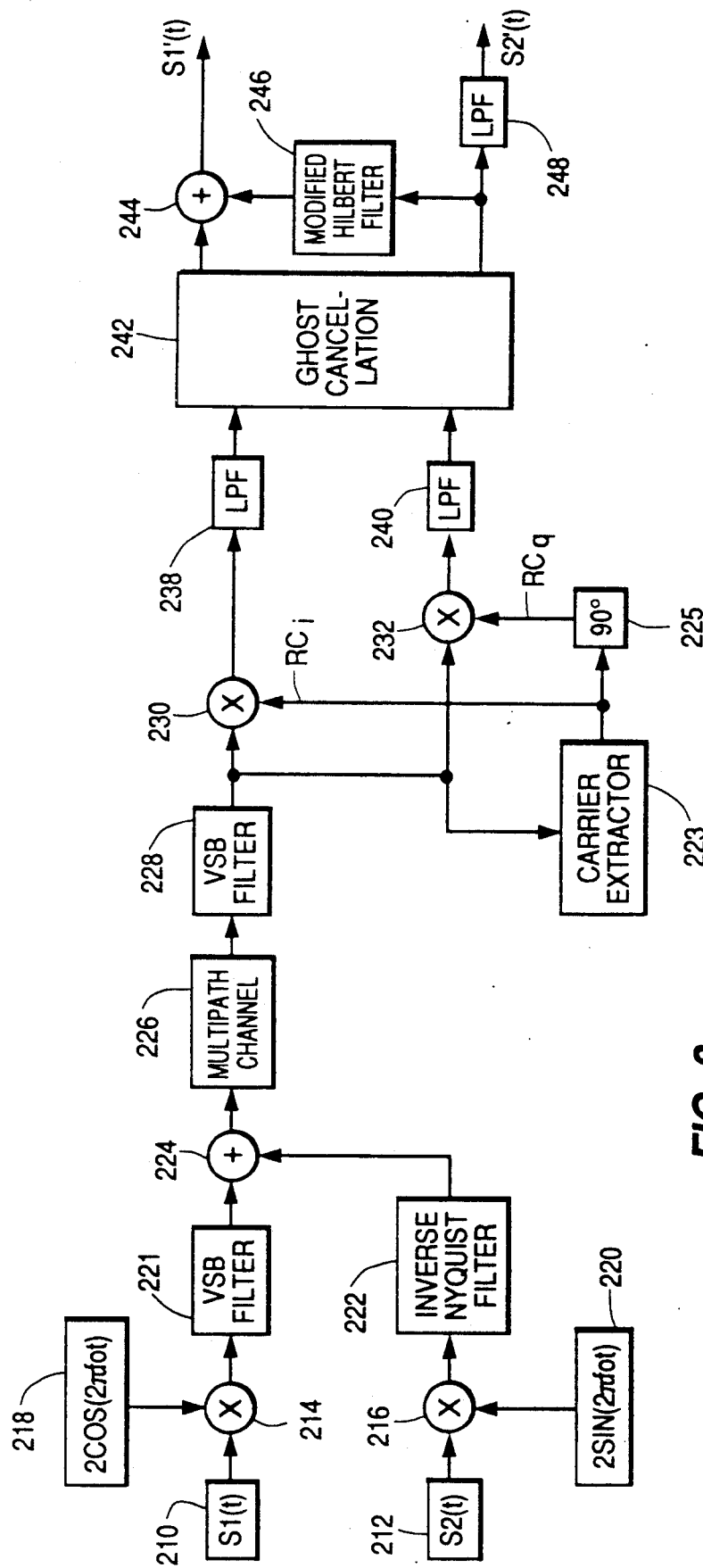
FIG. 2 is a block diagram of circuitry which includes a first embodiment of the present invention.

FIG. 2 is a block diagram of circuitry which includes a first embodiment of the present invention. The transmitter side of the circuitry shown in FIG. 2 is the same as that described above in reference to FIG. 1 and, so, is not described in detail here. The differences between the receiver shown in FIG. 2 and that shown in FIG. 1 begin with their respective IF amplifiers The exemplary embodiment of the present invention, shown in FIG. 2, uses a single IF amplifier which includes a vestigial sideband filter 228. The VSB filter 228 used in this embodiment of the invention is a commercially available surface acoustic wave (SAW) filter such as the model 03947, BP-44-5000-1.2 manufactured by Anderson Laboratories. This filter has a frequency response characteristic which approximates the ideal characteristic shown in FIG. 3c.

The output signal provided by the VSB filter 228 is applied to two synchronous demodulators 230 and 232. These demodulators demodulate the signal provided by the filter 228 using two quadrature phase related oscillatory signals derived from the output signal of the VSB filter 228 by the carrier extraction circuitry 225 and 90° phase shifting circuitry 223. This circuitry may operate in the same manner as the carrier regenerator and phase shifter disclosed in the above referenced U.S. Pat. No. 4,882,614.

The signals produced by the demodulators 230 and 232 are low-pass filtered by the filters 238 and 240 to produce signals $R_i$ and $R_q$ which approximately occupy frequency bands of 0Hz to 4.2 MHz. As set forth below, distortion, caused by reflecting signal paths in the multipath channel 226, and crosstalk distortion. The crosstalk distortion may be caused by multipath as well as by phase errors in the carrier signal recovered by the regenerator circuitry 225, as described above, and by the asymmetric sidebands of the quadrature phase component of the signal applied to the demodulator 230.

The multipath distortion components of the two signals $R_i$ and $R_q$ are substantially removed by the ghost cancellation filter 242. Circuitry suitable for use as the filter 242 is disclosed in the above-referenced U.S. Pat. No. 4,864,403.

To cancel the crosstalk distortion of the quadrature phase signal in the in-phase signal, this embodiment of the invention includes a modified Hilbert filter 246. The filter 246 has a frequency response characteristic which approximates the exemplary frequency response characteristic shown in FIG. 3d. This characteristic represents a standard Hilbert transform modified to compensate for the inverse Nyquist filter 222 used in the transmitter.

To explain the significance of the modified Hilbert filter, and how its output is related to its input, consider a sinusoidal input of amplitude A, which is denoted by $A \cdot \cos(2\pi f_1 t)$. Resolving this into complex vectors, the input can be represented as $(A/2)[\exp(j2\pi f_1 t) + \exp(j2\pi f_1 t)]$, where j is the well-known factor $\sqrt{-1}$. If the frequency $f_1$ is less than 750 KHz, the positive and negative frequency phasors are given gains of $-j(f_1/750)$ and $j(f_1/750)$, respectively; for simplicity we have expressed $f_1$ also in KHz in these quantities. It can then be seen that the filter output is $A(f_1/750)\sin(2\pi f_1 t)$. If the frequency fl of the sinusoid is greater than 750 KHz, the output equals $A \sin(2\pi f_1 t)$. If the input to the filter is $A \cdot \sin(2\pi f_1 t)$, the output is similarly shown to be $-A(f_1/750)\cos(2f_1 t)$, or $-A \cdot \cos(2\pi f_1 t)$, depending on $f_1$ less than or larger than 750 KHz.

To illustrate how the modified Hilbert filter 246 eliminates or substantially reduces the crosstalk when used in conjunction with the receiver VSB filter 228, consider sinusoidal inputs at the transmitter. To simplify the following description, it is assumed that the channel has no multipath and that there is no ghost cancellation filter. We may then assume that the source signals S1(t) and S2(t) equal $a \cdot \cos(2\pi f_1 t)$ and $b \cdot \cos(2\pi f_1 t)$, respectively. At the transmitter VSB filter 221 output the signal is the sum of components $a \cdot \cos[2\pi(f_O + f_1)t]$ and $a \cdot \cos[2\pi(f_O + t_1)t]$. If $f_1$ is larger than 750 KHz, only the upper sideband $a \cdot \cos[2\pi(f_O + f_1)t]$ appears at the output of the receiver VSB filter 228. If $f_1$ is less than 750 KHz, both upper and lower sidebands appear at the VSB filter 228 output. Demodulation by the in-phase carrier $RC_1$, which is proportional to $\cos(2\pi f_O t)$, produces at the output of the lowpass filter 238, either $2a \cdot \cos(2\pi f_1 t)$, or $a \cdot \cos(2\pi f_1 t)$, depending if $f_1$ is smaller, or larger than 750 KHz. Demodulation by the quadrature carrier $RC_q$, which is proportional to $\sin(2\pi f_O t)$, produces at the output of the lowpass filter 240, either zero signal, or $-a \cdot \sin(2\pi f_1 t)$, depending upon if $f_1$ is smaller than, or larger than, 750 KHz, respectively. As a result of the discussion in the preceding paragraph, the output of the modified Hilbert filter 246 is $+a \cdot \cos(2\pi f_1 t)$, if $f_1$ is greater than 750 KHz, and zero if $f_1$ is smaller than 750 KHz. Adding this signal to the output of the lowpass filter 238 produces $2a \cdot \cos(2\pi f_1 t)$, irrespective of the value of $f_1$, as long as it is less than 4.2 MHz. If the input S1(t) is the sinusoid $a \cdot \sin(2\pi f_1 t)$, similar arguments will result in showing that it will be reproduced at the output of the adder 244 with constant gain, irrespective of the value of $f_1$, as long as it is less than 4.2 MHz. Further, since any signal can be resolved, through the notion of Fourier transforms to spectral components, repeating the above arguments will show that the signal S1(t) will be reproduced at output of the adder 244 with uniform gain, and no crosstalk from the quadrature channel input signal S2(t).

Figure 3A:
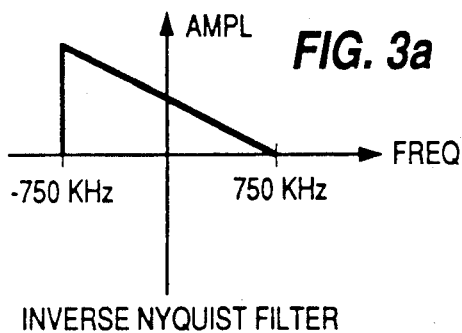
FIGS. 3a through 3e are graphs of frequency versus amplitude which represent the frequency response characteristics of filters used in the circuitry shown in FIGS. 1, 2 and 4.
Figure 3B:
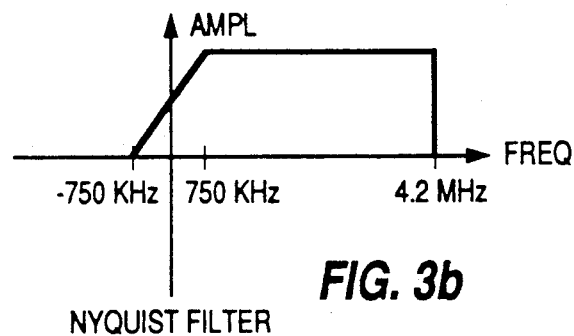
Figure 3C:
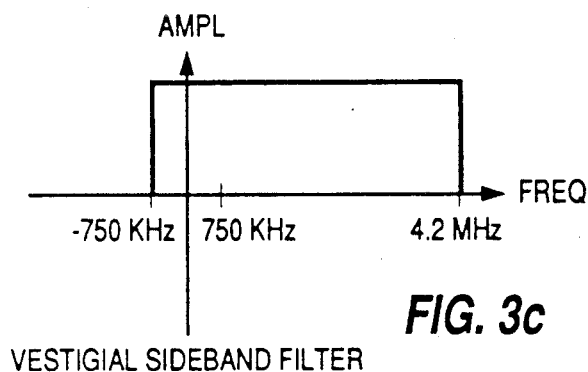

Consider now the input S2(t), which will be assumed initially to be a sinusoid $b \cdot \cos(2\pi f_1 t)$. The output of the modulator 216 can then be represented as $b \cdot \sin[2\pi(f_0 + f_1)t] + b \sin[2\pi(f_0 - f_1)t]$. The inverse Nyquist filter 222, the form of which is shown in FIG. 3a, introduces gains of g and g' to the upper and lower sidebands, at frequencies $f_0 + f_1$ and $f_0 - f_1$ respectively. The gain constants g and g' are frequency dependent, and are such that $g + g'$ equals unity. In-phase demodulation with the carrier $RC_1$, which is proportional to $\cos(2\pi f_0 t)$ produces at the output of the lowpass filter 238 the signal $b(g - g')\sin(2\pi f_1 t)$. This is a crosstalk term from the quadrature signal S2(t) into the in-phase detector. Quadrature demodulation by $RC_q$, which is proportional to $\sin(2\pi f_0 t)$, of the inverse Nyquist filter 222 output produces at the output of the lowpass filter 240 the signal $b(g + g')\cos(2\pi f_1 t)$, which equals $b \cdot \cos(2\pi f_1 t)$. Since $f_1$ is less than 750 KHz, the output of the modified Hilbert filter 246, corresponding to the input $b \cdot \cos(2\pi f_1 t)$ is $b(f_1/750)\sin(2\pi f_1 t)$. This is added to the signal $b(g - g')\sin(2\pi f_1 t)$, producing at the output of the adder 244, the signal $b[g - g' + (f_1/750)]\sin(2\pi f_1 t)$. Upon noting that the inverse Nyquist filter characteristics shown in FIG. 3a produce $g - g'$ to equal $-(f_1/750)$, it is seen that the crosstalk is eliminated Similar arguments will show that there is no crosstalk if S2(t) equals a sinusoidal component $b \cdot \sin(2\pi f_1 t)$. Since any signal can be resolved into cosine and sine components, it has been demonstrated here that the modified Hilbert filter 246 produces no crosstalk. Finally, it is seen that the output of the lowpass filter 240 equals S2(t), plus a crosstalking signal from S1(t) which has zero spectral energy in the frequency region less than 750 KHz. The crosstalk above 750 KHz is eliminated by the lowpass filter 248.

The signal provided by the filter 246 is an Hilbert transformed baseband quadrature signal. When combined, by the adder 244, with the baseband in-phase signal provided by the ghost cancellation filter 242, this signal effectively cancels any crosstalk distortion components caused by the demodulation of the inverse Nyquist filtered quadrature signal by the in-phase demodulator 230.

In addition to canceling the crosstalk distortion, the filter 246 equalizes the demodulated in-phase signal. To understand why this signal needs to be equalized, recall that the in-phase portion of the signal provided to the demodulator 230 by the vestigial sideband filter includes a double sideband portion and a single sideband portion. When this signal is synchronously demodulated, the amplitude of the signals derived from the double sideband portion of the modulated signal are twice the amplitude of the signals derived from the single sideband portion.

The modified Hilbert filter 246 compensates the demodulated in-phase signal for this amplitude difference. The filter 246 processes crosstalk components of the quadrature signal which correspond to the single sideband portion of the in-phase signal to generate in-phase signals. These signals occupy a band of frequencies from 750 KHz to 4.2 MHz and are thus outside of the band of frequencies occupied by the modulated supplementary signal, S2(t). This filter effectively generates the Hilbert transform of the Hilbert transformed signal to regenerate the original signal. When this processed signal is combined with the in-phase signal provided by the ghost cancellation circuitry 242, an in-phase signal S1'(t) is generated which has a substantially flat frequency spectrum for signal frequencies from 0 MHz to 4.2 MHz.

The high frequency components of the quadrature signal provided by the ghost cancellation filter 242 (i.e. the crosstalk components from the single sideband in-phase signal) are attenuated by the low-pass filter 248. Thus, the output signal provided by the filter 248 is the recovered supplementary signal, S2'(t).

Figure 3D:
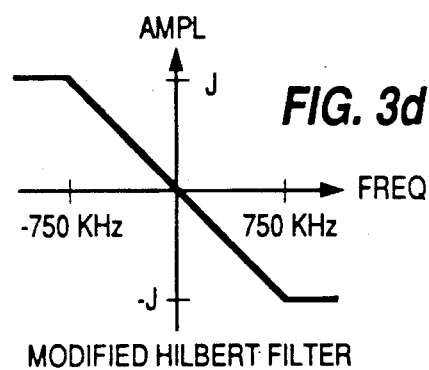
Figure 3E:
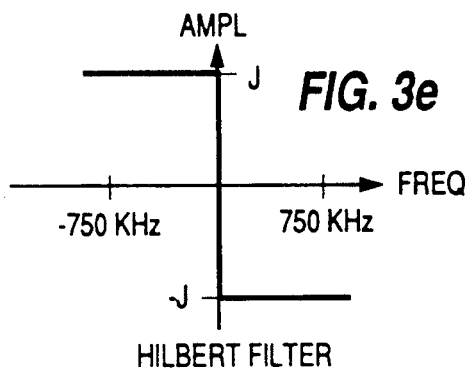
Figure 3F:
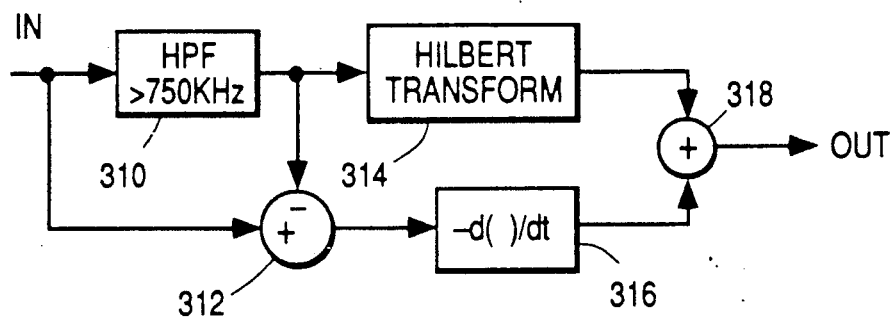
FIG. 3F is a block diagram of an exemplary circuit for providing a modified Hilbert filter function.

FIG. 3F illustrates circuitry for performing a modified Hilbert filter function Signal is applied to a highpass filter 310 which attenuates signal frequencies below 750 kHz, and to the minuend input of a subtracter 312. Filtered signal from filter 310 is applied to a Hilbert transform circuit 314 which performs a standard Hilbert transform on the highpass filtered signal. The output signal from the Hilbert transform circuit 314 is applied to one input of an adder circuit 318, which signal corresponds to the portions of the transfer function of FIG. 3d that are greater than 750 kHz and less than −750 kHz. Highpass filtered signal is also coupled to the subtrahend input of the subtracter 312 which provides signal frequencies less than 750 kHz. Lowpass filtered signal from the subtracter 312 is coupled to a circuit element 316 which provides the negative of the derivative of the signal applied thereto. Signal from the circuit 316, which signal corresponds to the portion of the transfer function defined by FIG. 3d between ±750 kHz, is coupled to a second input of the adder 318. Output signal from the adder 318 substantially conforms to the transfer function of FIG. 3d.

The signals S1'(t) and S2'(t) produced by the circuitry shown in FIG. 2 closely match the transmitted signals S1(t) and S2(t) only when the recovered carrier signals $RC_i$ and $RC_q$ closely match the original carrier signals $2COS(2\pi f_0 t)$ and $2SIN(2\pi f_0 t)$. As set forth above, this may not be so in the presence of a strong ghost signal having a carrier which is shifted in phase with respect to the main signal. In this instance, the true signals S1'(t) and S2'(t) may be recovered only if the frequency response characteristic of the modified Hilbert filter 246 is further modified to compensate for the phase shift in the signals S1'(t) and S2'(t) resulting from the error in the detection of the picture carrier signal.

Figure 4:
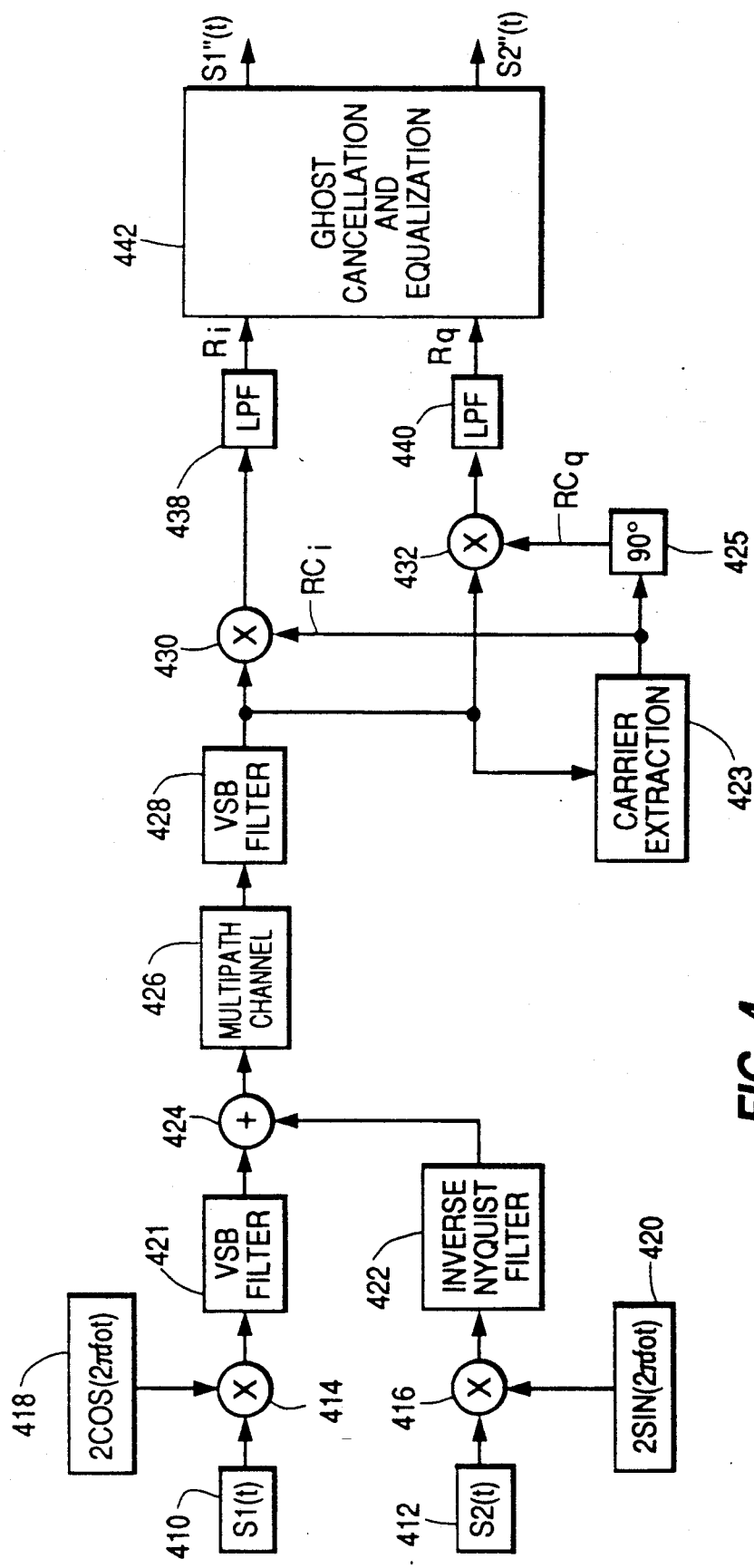
FIG. 4 is a block diagram of circuitry which includes a second embodiment of the present invention.

The receiver shown in FIG. 4 includes an alternative embodiment of the invention which automatically corrects for the crosstalk distortion resulting from a strong ghost signal. The circuitry shown in FIG. 4 is the same as that shown in FIG. 2 except that the ghost cancellation filter 242, adder 244, modified Hilbert filter 246, and low-pass filter 248 have been replaced by a ghost cancellation and equalization filter 442.

Figure 4A:
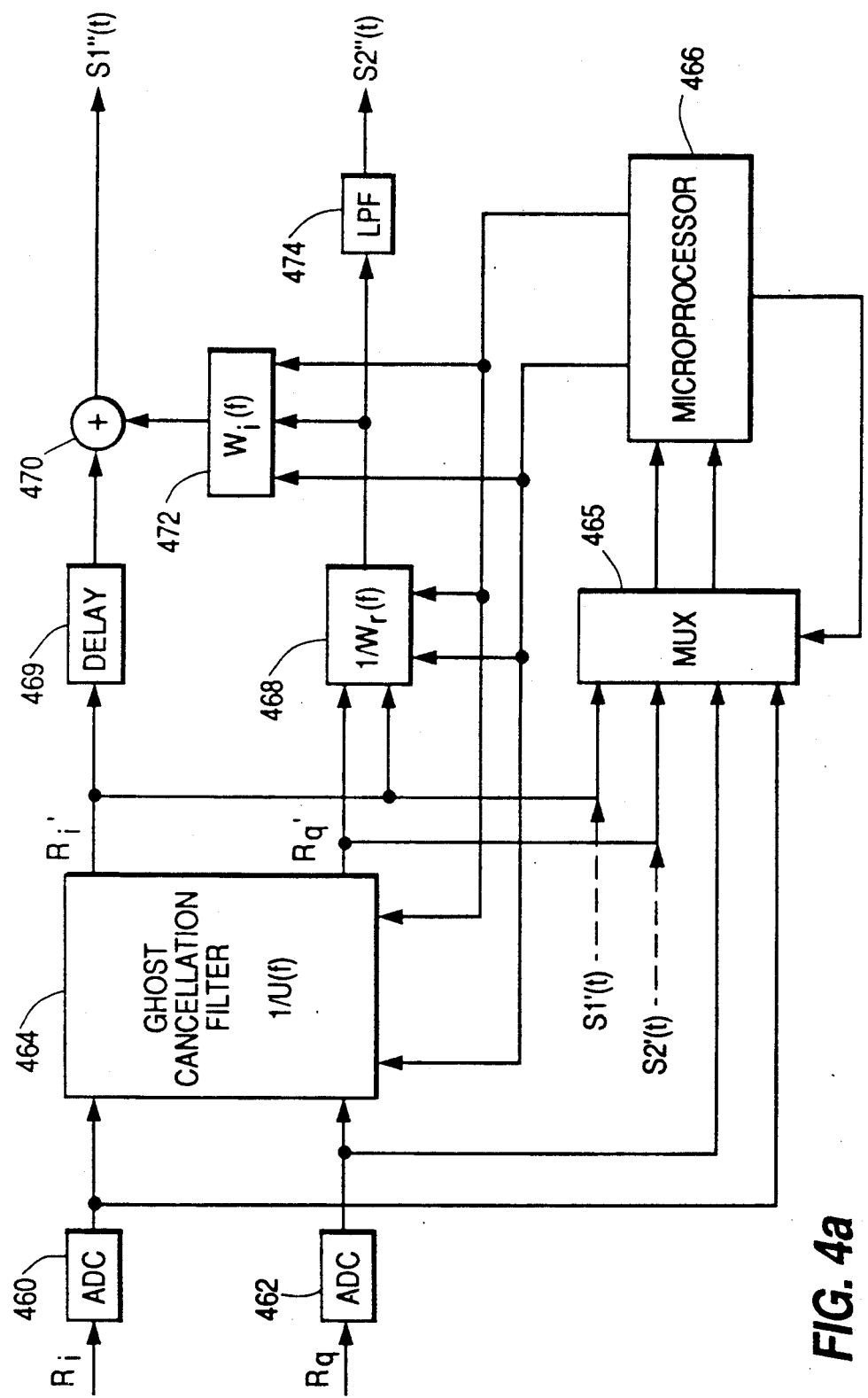
FIG. 4A is a block diagram of an exemplary ghost cancellation and equalization filter.

FIG. 4a is a block diagram of an exemplary ghost cancellation and equalization filter 442. The signals $R_i$ and $R_q$ provided by the respective low-pass filters 438 and 440 (shown in FIG. 4) are converted to digital data streams by the respective analog to digital converters (ADC's) 460 and 462. These digital data streams are applied to a partial ghost cancellation filter 464. The output signals $R_i'$ and $R_q'$ of the filter 464 are partially deghosted versions of the signals $R_i$ and $R_q$.

The signal $R_q'$ is applied to a filter 468 which corrects crosstalk distortion resulting from errors in the recovered carrier signals used to demodulate the received video signal. The output of the filter 468 is applied to a low-pass filter 474 which, in this embodiment of the invention, substantially attenuates signal components having frequencies greater than 750 KHz to produce the regenerated supplementary signal, S2''(t).

The output signal of the filter 468 is also applied to a filter 472, the output signal of which is applied to one input port of a adder 470. The other input port of the adder 470 is coupled to receive the signal $R_i'$ provided by the filter 464, via the compensating delay element 469. The signal generated by the filter 472, when added to the signal $R_i'$, substantially cancels crosstalk distortion in that signal resulting from demodulation phase errors and from the inverse-Nyquist filtering of the quadrature phase signal prior to transmission. In addition, the filter 472 performs a Hilbert filtering operation on the single sideband portion of the signal provided by the filter 468. This signal is added to the signal $R_i'$ to equalize the frequency spectrum of the demodulated in-phase signal as set forth above in the discussion of the system described with reference to FIG. 2. Thus, the output signal provided by the adder 470 is the regenerated video signal S1''(t).

Figure 5A:
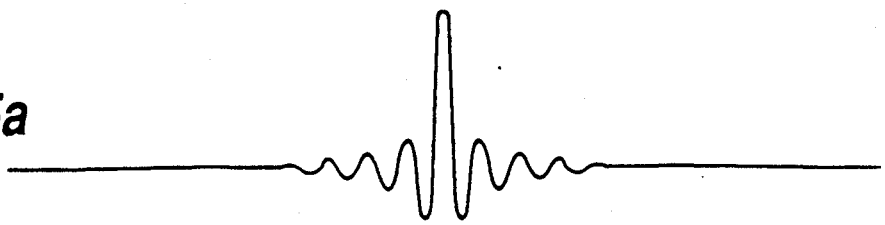
FIGS. 5a through 5d are graphical representations of signal amplitude versus time which are useful for explaining the operation of the circuitry shown in FIG. 4.
Figure 5B:

The filters 464, 468 and 472 are complex signal filters having programmable coefficients. The programmable coefficients for each of the filters 464, 468 and 472 are generated by a microprocessor 466 in response to a pair of training signals transmitted with the video signal. Exemplary in-phase and quadrature phase components of the first training signal are shown in FIGS. 5a and 5b, respectively. As shown in FIG. 5a, the in-phase training signal is a sine(x)/x pulse, though it may be any of a wide variety of forms such as pseudorandom sequences. The width of the illustrated pulse is selected so that the frequency spectrum of the in-phase signal is substantially flat for one horizontal line interval. During the time interval in which the first in-phase training signal is transmitted, no quadrature signal is transmitted as shown in FIG. 5b.

In analytical terms, the outputs of the lowpass filters 438 and 440 can be represented as a complex signal. This complex signal has two components, one due to the in-phase input S1(t), and the other due to the quadrature input signal S2(t). Let I(f) and Q(f) represent the Fourier transforms of S1(t) and S2(t), respectively. Then the Fourier transform Z'(f) of the complex outputs of the lowpass filters 438 and 440 may be represented by the equation (1).

$$Z'(f) = I(f)U(f) + jQ(f)V(f) \tag{1}$$

The analytical basis of this embodiment may be described as follows. Using a training signal, an estimate of U(f) is obtained. The inverse of U(f) then is implemented in the partial ghost cancellation filter 464, the output of which equals Z'(f)/U(f), which may be represented by equations (2) and (3)

$$Z'(f)/U(f) = I(f) + jQ(f)W(f) \tag{2}$$

where $$W(f) = V(f)/U(f) \tag{3}$$

A second training period is then used to estimate W(f), the real and imaginary parts of which may be represented by $W_r(f)$ and $W_i(f)$, respectively. With this representation, equation (2) can be represented also as $$Z'(f)/U(f) = I(f) - Q(f)W_i(f) + jQ(f)W_r(f)$$

The real part of the above expression is the transform of the output $R_i'$ of the partial ghost cancellation filter 464. The output $R_q'$ of this filter has the transform which equals the imaginary part of the quantity $Z'(f)/U(f)$, that is, $Q(f)W_i(f)$. Hence dividing the quantity $R_q'$, which in frequency domain has the response $Q(f)W_i(f)$ by $W_r(f)$ results in $Q(f)$. This operation is performed by the filter 468. The filter 472, the transfer function of which is $W_i(f)$, then produces at its output the signal with frequency response $Q(f)W_i(f)$. Adding this to the real part of $Z'(f)/U(f)$ produces $I(f)$, without any crosstalk. This operation is done in the adder 470. The filter 474 is included to eliminate noise outside 750 KHz.

Because the $\sin(x)/x$ pulse was chosen as the in-phase training signal, the frequency spectrum of the in-phase signal, that is to say $I(f)$, may be approximated as a constant and the equation (1) may be normalized such that the constant has a value of unity. Thus, the equation (1) becomes:

$$Z'(f) = U(f).$$

To determine the frequency response characteristic, $U(f)$, of the multipath channel 426, the microprocessor 466 is conditioned by its program to first correlate a stored $\sin(x)/x$ function to the signals provided by the ADC's 460 and 462. This operation produces rough estimates of the time and phase delay characteristics of the various reflective signal paths in the multipath channel. Next, the microprocessor 466 is conditioned to obtain an optimized estimate of delay characteristics of the various data paths and the respective attenuation factors applied to the original signal. From this data, the programmed microprocessor 466 can generate an optimized estimate of the frequency response characteristic of the multipath channel. The determined frequency response characteristic is then inverted to generate a frequency response characteristic $1/U(f)$ which defines the programmable coefficient values for the ghost cancellation filter 464. The above referenced U.S. Pat. No. 4,864,403 describes an exemplary structure for the ghost cancellation filter 464 and exemplary methods which may be used to generate the optimized estimate of the frequency response characteristic of the multipath channel and to invert the computed frequency response characteristic to produce coefficient values for the filter 464.

Figure 5C:
Figure 5D:

During the second training interval, the in-phase signal is set to zero and a $\sin(x)/x$ pulse is sent for the quadrature phase signal, as shown in FIGS. 5c and 5d, respectively. During this training interval, the microprocessor takes the deghosted signals $R_i'$ and $R_q'$ as the training signals. The complex signal $Z'(f)/U(f)$ provided by the ghost cancellation filter 464 may be represented by the equation (4).

$$Z'(f)/U(f) = jQ(f)W(f) \tag{4}$$

where j is the complex quantity representing the square root of $-1$, $Q(f)$ is the frequency domain representation of the transmitted quadrature-phase signal and $W(f)$ defines a frequency response characteristic representing the combination of the multipath channel and the ghost cancellation filter as they affect the transmitted quadrature phase signal. Since $Q(f)$ is a $\sin(x)/x$ pulse during the training interval, the equation (4) may be reduced to equation (5).

$$Z'(f)/U(f) = jW(f) \tag{5}$$

The frequency response characteristic $W(f)$ may be further resolved into real and imaginary components as illustrated by equation (6).

$$W(f) = W_r(f) + jW_i(f) \tag{6}$$

In the present embodiment of the invention, the filter 468 which equalizes the frequency spectrum of the signal $R_q'$ to generate the signal $S2''(t)$ has a frequency response characteristic which is the inverse of the real component of $W(f)$, that is to say, $1/W_r(f)$. The signal which is combined with the signal $R_i'$ by the adder 470 is the signal $R_q'$ as filtered by a frequency response characteristic $W_i(f)/W_r(f)$. Thus, the filter 472 has a frequency response characteristic of $W_i(f)$.

Since the signal provided to the filters 468 and 472 is substantially free of ghost signal distortion, these filters may have a canonical structure, such as that of a two-dimensional transversal filter, including a relatively small number of equally spaced taps, each having a programmable weighting coefficient. An exemplary filter structure is shown in U.S. Pat. No. 4,882,614 entitled MULTIPLEX SIGNAL PROCESSING APPARATUS which is hereby incorporated by reference. Each of these filters may have, for example, approximately sixteen fixed taps in each of the in-phase and quadrature phase signal paths.

The coefficients which define the frequency response characteristics of the filters 468 and 472 are generated by the microprocessor 466 operating under the control of a program described in the flow-chart diagram shown in FIG. 6. The first step in this program, 610, collects 1,536 samples (768 samples for each of the signals $R_i'$ and $R_q'$) representing the active interval of the horizontal line interval containing the $\sin(x)/x$ pulse transmitted during the second training interval. The signals $R_i'$ and $R_q'$ are the respective signals shown in FIGS. 5c and 5d passed through a filter having the frequency response characteristic $w(f)$.

Since the frequency spectrum of the $\sin(x)/x$ pulse is substantially constant over the selected time interval, the frequency spectrum of the complex signal $R_i' + jR_q'$ is a good approximation of the frequency response characteristic $W(f)$. Thus, the next step in the program shown in FIG. 6, step 612, is to perform a fast Fourier transform (FFT) on the samples collected in step 612. This operation produces a representation of the frequency spectrum of the signal $R_i' + jR_q'$, which is also a representation of the frequency response characteristic $W(f)$.

The next step in the program, 614, processes the representation of the frequency response characteristic $W(f)$ to generate an equivalent representation having the form $W_r(f) + jW_i(f)$. At step 616, the frequency response characteristic $W_r(f)$ is inverted to generate a representation of the frequency response characteristic $1/W_r(f)$. Next, at steps 618 and 620, the microprocessor 466 generates coefficients for the respective filters 468 and 472 to implement the frequency response characteristics $1/W_r(f)$ and $W_i(f)$, respectively.

As set forth in the above-referenced U.S. Pat. No. 4,864,403, to mitigate the effects of radio-frequency (RF) noise, it may be desirable to accumulate samples representing several training intervals in step 610. These accumulated samples may then be divided by the number of sample intervals that have been accumulated to provide a reference signal having reduced RF noise distortion.

The signal provided by the filter 468 is applied to a low-pass filter 474 to remove signal components having frequencies greater than 750 KHz. The output signal of this filter is a regenerated supplementary signal S2"(t). The signal provided by the filter 472 is added to the signal provided by the compensating delay element 469 to produce the regenerated main signal S1"(t). The inventors have determined that the signals S1"(t) and S2"(t) are good approximations of the original signals S1(t) and S2(t).

As indicated in FIG. 4a, the signals to be analysed ($R_i'$,$R_q'$) during the training interval are taken directly from the outputs of the filter 464. It should be appreciated by those skilled in the art of filter design, that the signals S1'(t) and S2'(t) may be used for this analysis. This is indicated in FIG. 4a by the dashed arrows labelled S1'(t) and S2'(t).

While this invention has been disclosed in terms of two exemplary embodiments, it may be practiced as outlined above with modifications within the spirit and scope of the appended claims.

In the claims the term modified Hilbert filter is intended to describe a filter which performs a transfer function substantially of the form indicated in FIG. 3d. However it is not meant to be limited to having a straight line slope, but that the slope be skew symmetric about the vertical axis. The slope may be either positive or negative depending upon the polarity with which the signal provided thereby is combined with the in-phase signal.

What is claimed is:

1. In apparatus for receiving a television signal having a first and second quadrature phase related picture carrier signals modulated by a main video signal and a supplementary video signal, respectively, wherein the second modulated carrier signal has unequal sidebands which add undesirable crosstalk distortion signal components to said first modulated carrier signal, apparatus for separating the main and supplementary video signals from said received television signal, comprising:

first and second synchronous detecting means, for demodulating said television signal to recover said main and supplementary video signals, wherein the recovered main video signal includes said quadrature crosstalk distortion components;

a modified Hilbert filter, having a transfer function wherein the transition between its phase extreme has finite slope, coupled to receive said recovered supplementary video signal for generating a phase translated supplementary video signal which, when combined with said recovered main video signal, substantially cancels the quadrature crosstalk distortion components; and means for combining said phase translated supplementary video signal with said recovered main video signal.

2. In apparatus for receiving television signal having a first and second quadrature phase related picture carrier signals modulated by a main video signal and a supplementary video signal, respectively, wherein the second modulated carrier signal has unequal sidebands which add undesirable crosstalk distortion signal components to said first modulated carrier signal, apparatus for separating the main and supplementary video signals from said received television signal, comprising:

means for receiving said television signal;

first and second synchronous detecting means, for demodulating said television signal to recover said main and supplementary video signals, wherein the recovered main video signal includes said quadrature crosstalk distortion components;

vestigial sideband filter means coupled between said means for receiving said television signal and said first and second demodulating means for filtering said received television signal to substantially eliminate out-of-band signal components from the signal applied to said first and second demodulating means;

phase translating filter means, coupled to receive said recovered supplementary video signal for generating a phase translated supplementary video signal which, when combined with said recovered main video signal, substantially cancels the quadrature crosstalk distortion components in a first frequency range of the main video signal and said phase translating filter means includes means for converting the quadrature crosstalk distortion components of the main video signal into signal components that are in-phase with said recovered main video signal in a second frequency range of said main video signal; and means for combining said phase translated supplementary video signal with said recovered main video signal.

3. The apparatus of claim 2, wherein:

said modulated second carrier signal component of said television signal has a frequency spectrum of the form produced by passing a double sideband signal through an inverse Nyquist filter; and said phase translating filter means includes a modified Hilbert filter.

4. The apparatus of claim 3 wherein a portion of the frequency response characteristic of said phase translating filter is selected to be complex conjugate with the inverse Nyquist frequency spectrum of the modulated second carrier signal component of said television signal.

5. The apparatus of claim 2 wherein the television signal includes a training signal occupying a training interval and said phase translating filter means includes:

programmable filter means, coupled to said second demodulating means and having an adjustable frequency response characteristic, for processing said received supplementary video signal to develop said phase translated supplementary video signal; and computing means responsive to said received main and supplementary video signals during said training interval for adjusting the frequency response characteristic of said programmable filter means to generate said phase translated supplementary video signal which substantially cancels the crosstalk distortion signal components of said received main video signal.

6. The apparatus set forth in claim 5 wherein said training signal component of said modulated second carrier signal has a frequency spectrum which is essentially flat during said training interval and said modulated second carrier signal is processed by a filter having an inverse Nyquist frequency response characteristic prior to being combined with said modulated first carrier signal to form said television signal; and said computing means adjusts said programmable filter means to have a frequency response characteristic representing the product of the frequency response characteristic of an inverse Hilbert filter and the frequency spectrum of the received supplementary video signal during said training interval.

7. In a television receiver for receiving a television signal having a vestigial sideband modulated main video signal component and an inverse Nyquist filtered, double sideband modulated supplementary video signal component, apparatus for recovering said main and supplementary video signal components comprising:

means for receiving said television signal;

vestigial sideband filter means for filtering said received television signal to substantially eliminate out-of-band signals;

first and second synchronous demodulating means for generating recovered main and supplementary video signals, respectively, from said filtered television signal, wherein said each of said recovered main and supplementary video signals includes undesirable quadrature crosstalk distortion signal components related to said supplementary video signal and to said main video signal, respectively;

phase translating filter means for filtering said recovered supplementary video signal to generate a phase translated recovered secondary signal which, when combined with said recovered main video signal, substantially cancels the quadrature distortion components of said supplementary video signal in said main video signal and converts the quadrature distortion components of said main video signals in said supplementary video signal into in-phase signal components which reenforce said recovered main video signal; and means for combining the phase translated recovered secondary video signal with the recovered main video signal.

8. The apparatus of claim 7 wherein said television signals include undesirable multipath distortion components which result in corresponding multipath distortion components in the recovered main and supplementary video signals and said apparatus further includes automatic ghost cancellation filtering means coupled to said first and second synchronous demodulating means for significantly reducing the amplitude of the multipath distortion components in said recovered main and supplementary video signals.

9. The apparatus of claim 8 wherein said phase translating filter means includes a modified Hilbert filter.

10. The apparatus of claim 8 wherein the television signal includes a training signal occupying a training interval and said phase translating filter means includes:

programmable filter means, coupled to said second demodulating means and having an adjustable frequency response characteristic, for processing said received supplementary video signal to develop said phase translated supplementary video signal; and computing means responsive to said received main and supplementary video signals during said training interval for adjusting the frequency response characteristic of said programmable filter means to generate said phase translated supplementary video signal which substantially cancels the quadrature crosstalk distortion signal components of said recovered main video signal.

11. In a television receiver for receiving a television signal having a vestigial sideband modulated main video signal component and an inverse Nyquist filtered double sideband supplementary video signal component, a method of recovering said main and supplementary video signal components comprising the steps of:

receiving said television signal;

filtering said received television signal to substantially eliminate out-of-band signal components;

demodulating the filtered television signal to generate recovered main and supplementary video signals, wherein said each of said recovered main and supplementary video signals includes undesirable quadrature crosstalk distortion signal components related to said supplementary video signal and to said main video signal, respectively;

filtering said recovered supplementary video signal using a phase translating filter to generate a phase translated recovered secondary signal which, when combined with said recovered main video signal, substantially cancels the quadrature distortion components of said supplementary video signal and converts the quadrature distortion components of said main video signals into in-phase signal components which reenforce said recovered main video signal; and combining the phase translated recovered secondary video signal with the recovered main video signal.

12. In apparatus for receiving a television signal having first and second quadrature phase related picture carrier signals modulated by a main video signal and a supplementary video signal, respectively, wherein the received television signal includes multipath signal components, and said first modulated carrier signal includes undesirable crosstalk distortion signal components from the second modulated carrier signal, circuitry for processing said television signal comprising:

first and second synchronous detecting means, for demodulating said television signal to recover said main and supplementary video signals;

complex deghosting apparatus having first and second input terminals coupled respectively to said first and second synchronous detecting means, for producing at first and second output terminals, respectively, said main video signal and said supplementary video signal, substantially free of said multipath signal components;

Hilbert filter means, coupled to the second output terminal of said deghosting means, for generating a phase translated supplementary video signal which, when combined with deghosted main video signal, substantially cancels the quadrature crosstalk distortion components; and means coupled to said first output terminal of said deghosting means and said Hilbert filter means for combining said phase translated supplementary video signal and deghosted main video signal to produce main video signal substantially free of said multipath signal components and said quadrature crosstalk distortion components.

13. The apparatus set forth in claim 12 further including:

vestigial sideband filter means arranged to receive said television signal; and means for coupling said vestigial sideband filter means to said first and second synchronous detecting means.

* * * * *